United States Patent
Dou et al.

(10) Patent No.: US 8,224,400 B2
(45) Date of Patent: Jul. 17, 2012

(54) SYSTEMS AND TECHNIQUES FOR REDUCING POWER CONSUMPTION IN A MOBILE COMPUTING DEVICE

(75) Inventors: Weiping Dou, San Jose, CA (US); James Samuel Bowen, Santa Clara, CA (US); Olivier Boireau, Los Altos, CA (US); Avi Kopelman, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 776 days.

(21) Appl. No.: 11/756,476

(22) Filed: May 31, 2007

(65) Prior Publication Data
US 2008/0300027 A1 Dec. 4, 2008

(51) Int. Cl.
*H04B 1/38* (2006.01)
(52) U.S. Cl. .................. 455/574; 455/575.7
(58) Field of Classification Search .......... 455/550.1, 455/571, 572, 573, 574, 575.5, 575.7, 127.1, 455/127.5, 129
See application file for complete search history.

(56) References Cited

U.S. PATENT DOCUMENTS

| | | | |
|---|---|---|---|
| 2002/0094789 A1* | 7/2002 | Harano | 455/90 |
| 2002/0132653 A1* | 9/2002 | Okamoto et al. | 455/574 |
| 2003/0064761 A1* | 4/2003 | Nevermann | 455/572 |
| 2008/0139144 A1* | 6/2008 | Behzad | 455/127.1 |

OTHER PUBLICATIONS

R.A. Sadeghzadeh and N.J. McEwan, Prediction of head proximity effect on antenna impedance using spherical wave expansions, Aug. 18, 1994, Electronics Letters, vol. 30 No. 17, pp. 1365-1366.*

* cited by examiner

*Primary Examiner* — Ping Hsieh

(57) ABSTRACT

Various embodiments are directed to systems and techniques for reducing power consumption in a mobile computing device. In one or more embodiments, a mobile computing device may be arranged to determine a user environment based on detected antenna impedance or detected current. After the user environment is determined, the mobile computing device may confirm that total radiation power (TRP) for the mobile computing device at an initial conducted power level exceeds the minimum TRP threshold required by the network carrier to receive acceptable quality of service (QoS). Based on the excess TRP for the particular user environment, the mobile computing device may determine a reduced conducted power level to be input to an antenna system. Accordingly, significant power savings may be achieved. To save additional power, the mobile computing device may automatically adjust and/or improve antenna impedance matching based on user environment allowing a further reduction in conducted power. Other embodiments are described and claimed.

24 Claims, 8 Drawing Sheets

SYSTEMS AND TECHNIQUES FOR REDUCING POWER CONSUMPTION IN A MOBILE COMPUTING DEVICE

BACKGROUND

A mobile computing device typically operates using one or more transceivers and one or more antennas to provide voice and data communications functionality. Antenna impedance mismatch may result in dropped calls and increased power consumption. Antenna impedance mismatch worsens when the mobile computing device is in talk position because the head of a user is a lossy dielectric material and typically absorbs 1-6 dB energy radiating from the mobile computing device. As a result, users may have more dropped calls and consume more power when using a mobile computing device in talk position than in a hands-free environment.

Battery life is reduced when more power is drained from the battery. As the form factors for mobile computing devices continue to decrease, less space is available for a larger battery to extend talk time. Accordingly, there exists the need for improved systems and techniques for reducing power consumption in a mobile computing device.

DETAILED DESCRIPTION

Various embodiments are directed to systems and techniques for reducing power consumption in a mobile computing device. In one or more embodiments, a mobile computing device may be arranged to determine a user environment based on detected antenna impedance or detected current. After the user environment is determined, the mobile computing device may confirm that total radiation power (TRP) for the mobile computing device at an initial conducted power level exceeds the minimum TRP threshold required by the network carrier to receive acceptable quality of service (QoS). Based on the excess TRP for the particular user environment, the mobile computing device may determine a reduced conducted power level to be input to an antenna system. Accordingly, significant power savings may be achieved. To save additional power, the mobile computing device may automatically adjust and/or improve antenna impedance matching based on user environment allowing a further reduction in conducted power. Other embodiments are described and claimed.

Figure 1:
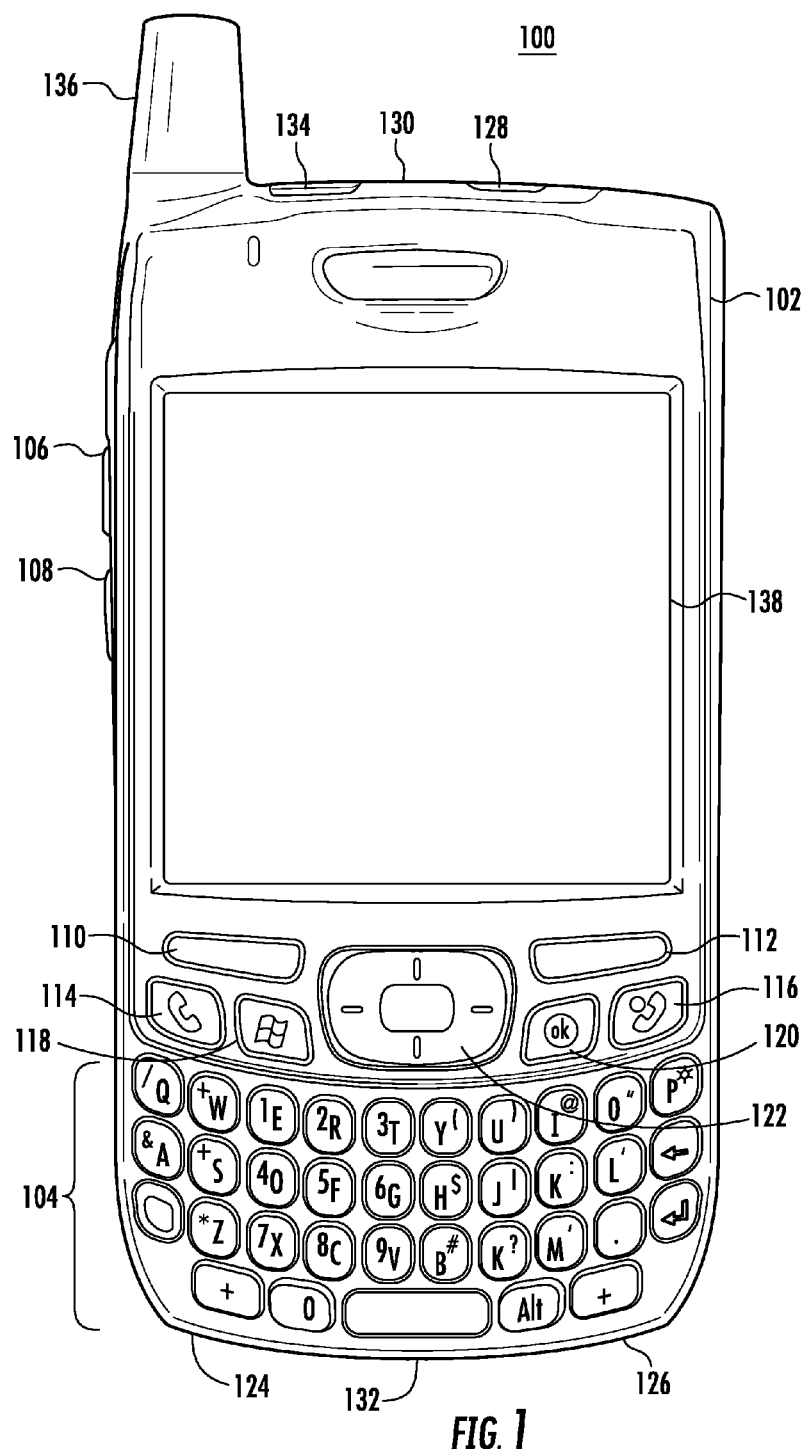
FIG. 1 illustrates one embodiment of a mobile computing device.

FIG. 1 illustrates a mobile computing device 100 in accordance with one or more embodiments. The mobile computing device 100 may be implemented as a combination handheld computer and mobile telephone, sometimes referred to as a smart phone. Examples of smart phones include, for example, Palm® products such as Palm® Treo™ smart phones. Although some embodiments may be described with the mobile computing device 100 implemented as a smart phone by way of example, it may be appreciated that the embodiments are not limited in this context. For example, the mobile computing device 100 may comprise, or be implemented as, any type of wireless device, mobile station, or portable computing device with a self-contained power source (e.g., battery) such as a mobile telephone, personal digital assistant (PDA), combination mobile telephone/PDA, handheld computer, gaming console, mobile unit, subscriber station, game device, media player, pager, messaging device, data communication device, or any other suitable computing or processing system in accordance with the described embodiments.

Mobile computing device 100 may comprise a housing 102. Housing 102 may include one or more materials such as plastic, metal, ceramic, glass, carbon fiber, various polymers, and so forth, suitable for enclosing and protecting the internal components of mobile computing device 100. Housing 102 may be used to encapsulate various internal components for mobile computing device 100 such as a removable and rechargeable battery, processors, memory, transceivers, printed circuit boards, antennas, and so forth. In various embodiments, housing 102 may have a shape, size and/or form factor capable of being held with an average human hand, such as a handheld computer, cellular telephone, PDA, combination PDA/cellular telephone, smart phone, and so forth.

Mobile computing device 100 may comprise various input/output (I/O) devices, such as an alphanumeric keyboard, alphanumeric keypad, numeric keys, keys, buttons, switches, rocker switches, multi-directional rocker switches, a microphone, an audio headset, a camera, a touch-sensitive display screen, a stylus, and so forth. As shown in FIG. 1, for example, mobile computing device 100 may comprise an alphanumeric keyboard 104 having a QWERTY key layout and an integrated number dial pad. Mobile computing device 100 may comprise various buttons such as, for example, a volume button 106, a customizable button 108, a left action button 110, a right action button 112, a phone/send button 114, a power/end button 116, a start button 118, an OK button 120, and a navigation button 122. Mobile computing device 100 may comprise an audio port 124 to connect an audio headset, a microphone 126, a ringer on/off switch 128 having a vibrate mode, and an expansion slot 130 to support a multimedia and/or memory card, for example.

Mobile computing device 100 may comprise a serial connection port 132, an infrared port 134, integrated Bluetooth® wireless capability, and/or integrated 802.11x (WiFi) wireless capability, to enable wired (e.g., USB cable) and/or wireless connection to a local computer system, such as a local personal computer (PC). In various implementations, mobile computing device 100 may be arranged to transfer and/or synchronize information with the local computer system.

Mobile computing device 100 may comprise a display 138. Display 138 may comprise any suitable display unit for displaying information appropriate for mobile computing device 100. In addition, display 138 may be implemented as an additional I/O device, such as a touch screen, touch panel, touch screen panel, and so forth. In one embodiment, for example, the display 138 may be implemented by a liquid crystal display (LCD) such as a touch-sensitive color (e.g., 16-bit color) thin-film transistor (TFT) LCD screen. In some cases, the touch-sensitive LCD may be used with a stylus and/or a handwriting recognizer program.

Mobile computing device 100 may comprise an antenna system including one or more antennas. The antennas may be internal antennas, external antennas, or a combination of both. In one embodiment, for example, the antenna system may include an external antenna 136 implemented as a stub antenna, a whip antenna, an extendable antenna, and so forth. The antenna system may also include one or more internal antennas, such as a planar inverted-F antenna, a planar inverted-L antenna, an inverted-F antenna with a helical structure, an inverted-L antenna with a helical structure, a monopole antenna, a meandered monopole antenna, a dipole antenna, a balanced antenna, a printed helical antenna, a chip antenna, a ceramic antenna, and so forth. The embodiments are not limited in this context.

In various embodiments, mobile computing device 100 may be arranged to perform power saving techniques. In one or more embodiments, the mobile computing device 100 may be arranged to determine a user environment based on detected antenna impedance or detected current, confirm that TRP at an initial conducted power level exceeds a minimum TRP threshold, determine a reduced conducted power level to be input to the antenna system based on the excess TRP for the particular user environment. To save additional power, the mobile computing device 100 may improve antenna impedance matching based on user environment allowing a further reduction in conducted power. Systems and techniques for reducing power in mobile computing device 100 may be described in more detail with reference to FIGS. 2-5.

Figure 2:
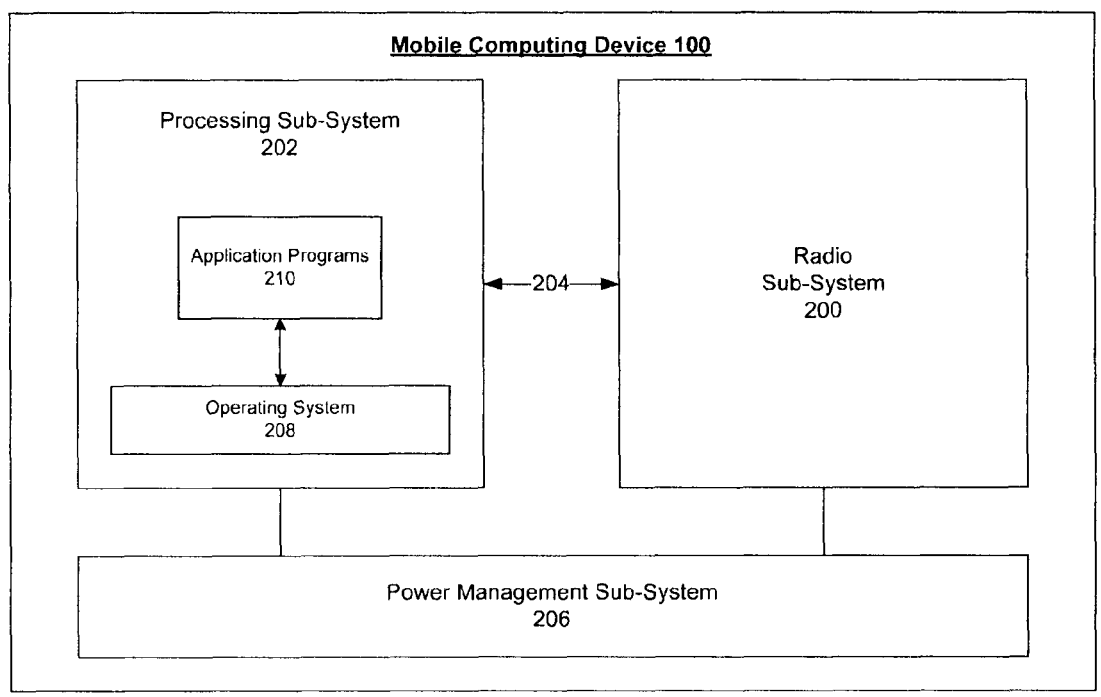
FIG. 2 illustrates one embodiment of a mobile computing device.

FIG. 2 illustrates a block diagram of mobile computing device 100 as described with reference to FIG. 1. As shown in FIG. 2, mobile computing device 100 may include a radio sub-system 200 and a processing sub-system 202. Radio sub-system 200 may perform voice and/or data communications operations on behalf of mobile computing device 100, and processing sub-system 202 may provide processing or computing resources to mobile computing device 100. Radio sub-system 200 and processing sub-system 202 may be coupled to each other and/or communicate using a bus 204. The bus 204 may be implemented by various interfaces such as one or more universal serial bus (USB) interfaces, micro-USB interfaces, universal asynchronous receiver-transmitter (UART) interfaces, general purpose input/output (GPIO) interfaces, control/status lines, control/data lines, audio lines, as well as others.

Mobile computing device 100 also may comprise a power management sub-system 206. Power management sub-system 206 may manage power for mobile computing device 100, including radio sub-system 200, processing sub-system 202, and other elements of mobile computing device 100. For example, power management sub-system 206 may include one or more batteries to provide direct current (DC) power, and one or more alternating current (AC) interfaces to draw power from an AC power source, such as a standard AC main power supply.

Radio sub-system 200 may provide voice and/or data communications functionality in accordance with different types of cellular telephone systems. Examples of cellular telephone systems may include Code Division Multiple Access (CDMA) systems, Global System for Mobile Communications (GSM) systems, North American Digital Cellular (NADC) systems, Time Division Multiple Access (TDMA) systems, Extended-TDMA (E-TDMA) systems, Narrowband Advanced Mobile Phone Service (NAMPS) systems, third generation (3G) systems such as Wide-band CDMA (WCDMA), CDMA-2000, Universal Mobile Telephone System (UMTS) systems, and others.

Radio sub-system 200 may be arranged to provide mobile packet data communications functionality in accordance with different types of cellular telephone systems. Examples of cellular telephone systems offering mobile packet data communications services may include GSM with General Packet Radio Service (GPRS) systems, CDMA/1xRTT systems, Enhanced Data Rates for Global Evolution (EDGE) systems, Evolution Data Only/Evolution Data Optimized (EV-DO) systems, Evolution For Data and Voice (EV-DV) systems, High Speed Downlink Packet Access (HSDPA) systems, High Speed Uplink Packet Access (HSUPA) systems, and others.

Radio sub-system 200 may be arranged to provide voice and/or data communications functionality in accordance with different types of wireless network systems. Examples of wireless network systems may include a wireless local area network (WLAN) system, wireless metropolitan area network (WMAN) system, wireless wide area network (WWAN) system, and so forth. Examples of suitable wireless network systems offering data communication services may include the Institute of Electrical and Electronics Engineers (IEEE) 802.xx series of protocols, such as the IEEE 802.11a/b/g/n series of standard protocols and variants (also referred to as "WiFi"), the IEEE 802.16 series of standard protocols and variants (also referred to as "WiMAX"), the IEEE 802.20 series of standard protocols and variants, and others.

Radio sub-system 200 may be arranged to perform data communications in accordance with different types of shorter range wireless systems, such as a wireless personal area network (PAN) system. One example of a suitable wireless PAN system offering data communication services may include a Bluetooth system operating in accordance with the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Other examples may include systems using infrared techniques or near-field communication techniques and protocols, such as electromagnetic induction (EMI) techniques. An example of EMI techniques may include passive or active radio-frequency identification (RFID) protocols and devices.

Processing sub-system 202 may be responsible for executing various software programs including system programs such as operating system (OS) 208 and application programs 210. System programs generally may assist in the running of mobile computing device 100 and may be directly responsible for controlling, integrating, and managing the individual hardware components of the computer system. The OS 208 may be implemented, for example, as one or more of a Palm OS®, Palm OS® Cobalt, Microsoft® Windows OS, Microsoft Windows® CE OS, Microsoft Pocket PC OS, Microsoft Mobile OS, Symbian OS™, Embedix OS, Linux OS, Binary Run-time Environment for Wireless (BREW) OS, JavaOS, a Wireless Application Protocol (WAP) OS, or other suitable OS in accordance with the described embodiments. Mobile computing device 100 may comprise other system programs such as device drivers, programming tools, utility programs, software libraries, application programming interfaces (APIs), and so forth.

Application programs 210 generally may allow a user to accomplish one or more specific tasks. In various implementations, application programs 210 may provide one or more graphical user interfaces (GUIs) to communicate information between mobile computing device 100 and a user. In some embodiments, application programs 210 may comprise upper layer programs running on top of the OS 208 that operate in conjunction with the functions and protocols of lower layers including, for example, a transport layer such as a Transmission Control Protocol (TCP) layer, a network layer such as an Internet Protocol (IP) layer, and a link layer such as a Point-to-Point (PPP) layer used to translate and format data for communication.

Examples of application programs 210 may include, without limitation, messaging applications, web browsing applications, personal information management (PIM) applications (e.g., contacts, calendar, scheduling, tasks), word processing applications, spreadsheet applications, database applications, media applications (e.g., video player, audio player, multimedia player, digital camera, video camera, media management), gaming applications, and so forth. It is also to be appreciated that mobile computing device 100 may implement other types of applications in accordance with the described embodiments.

Messaging applications may be arranged to communicate various types of messages in a variety of formats. Each messaging application may be representative of a particular kind of transport, enabling handling of messages of particular types and formats for the particular application. The messaging applications may comprise, for example, a telephone application such as a cellular telephone application, a Voice over Internet Protocol (VoIP) application, a Push-to-Talk (PTT) application, and so forth. The messaging applications may further comprise a voicemail application, a facsimile application, a video teleconferencing application, an IM application, an e-mail application, a Short Message Service (SMS) application, and a Multimedia Messaging (MMS) application. It is to be understood that the embodiments are not limited in this regard and that the messaging applications may include any other type of messaging or communications application in accordance with the described embodiments.

Radio sub-system 200 and processing sub-system 202 may comprise one or more processors and one or more types of memory for performing operations in accordance with the described embodiments. Examples of a processor may include, without limitation, a central processing unit (CPU), general purpose processor, dedicated processor, chip multi-processor (CMP), communications processor, radio processor, baseband processor, network processor, media processor, digital signal processor (DSP), media access control (MAC) processor, input/output (I/O) processor, embedded processor, co-processor, microprocessor, controller, microcontroller, application specific integrated circuit (ASIC), field programmable gate array (FPGA), programmable logic device (PLD), or other suitable processing device in accordance with the described embodiments.

Memory may comprise various types of computer-readable media capable of storing data such as volatile or non-volatile memory, removable or non-removable memory, erasable or non-erasable memory, writeable or re-writeable memory, and so forth. Examples of computer-readable storage media may include, without limitation, random-access memory (RAM), dynamic RAM (DRAM), Double-Data-Rate DRAM (DDRAM), synchronous DRAM (SDRAM), static RAM (SRAM), read-only memory (ROM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory, ovonic memory, ferroelectric memory, silicon-oxide-nitride-oxide-silicon (SONOS) memory, magnetic or optical cards, or any other suitable type of computer-readable media in accordance with the described embodiments. It can be appreciated that memory may be separate from a processor or may be included on the same integrated circuit as a processor. In some cases, some portion or the entire memory may be disposed on an integrated circuit or other medium (e.g., hard disk drive, memory card) external to radio sub-system 200 and/or processing sub-system 202 and accessible via a memory bus.

In various embodiments, mobile computing device 100 may comprise a dual processor architecture including a radio processor implemented by radio sub-system 200 and a host processor implemented by processing sub-system 202. In such embodiments, the radio processor may be implemented as a communications processor using any suitable processor or logic device, such as a modem processor or baseband processor. The host processor may be implemented as a host CPU using any suitable processor or logic device, such as a as a general purpose processor. Although some embodiments may be described as comprising a dual processor architecture for purposes of illustration, it is worthy to note that mobile computing device 100 may comprise any suitable processor architecture and/or any suitable number of processors in accordance with the described embodiments.

Figure 3:
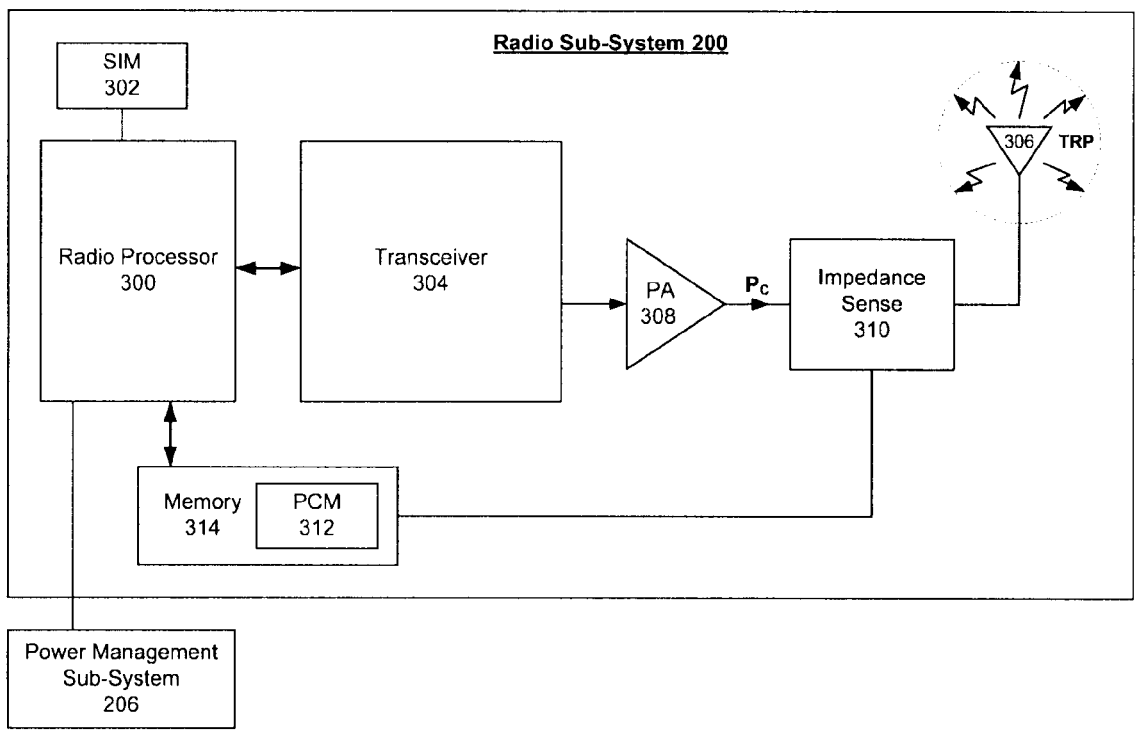
FIG. 3 illustrates one embodiment of a radio sub-system.

FIG. 3 illustrates a block diagram of one embodiment of radio sub-system 200 as described with reference to FIG. 2. Radio sub-system 200 may perform voice and/or data communication operations for mobile computing device 100. For example, radio sub-system 200 may be arranged to communicate voice information and/or data information over one or more assigned frequency bands of a wireless communication channel.

As shown in FIG. 3, radio sub-system 200 may comprise a radio processor 300. In various embodiments, radio processor 300 may be implemented as a communications processor using any suitable processor or logic device, such as a modem processor or baseband processor. Radio processor 300 may be arranged to perform analog and/or digital baseband operations such as digital-to-analog conversion (DAC), analog-to-digital conversion (ADC), modulation, demodulation, encoding, decoding, encryption, decryption, and so forth. Radio processor 300 may comprise both analog and digital baseband sections. The analog baseband section may include I & Q filters, analog-to-digital converters, digital-to-analog converters, audio circuits, and other circuits. The digital baseband section may include one or more encoders, decoders, equalizers/demodulators, Gaussian Minimum Shift Keying (GSMK) modulators, GPRS ciphers, transceiver controls, automatic frequency control (AFC), automatic gain control (AGC), power amplifier (PA) ramp control, and other circuits.

Radio sub-system 200 may comprise a subscriber identity module (SIM) 302 coupled to the radio processor 300. SIM 302 may comprise, for example, a removable or non-removable smart card arranged to encrypt voice and data transmissions and to store user-specific data for allowing a voice or data communications network to identify and authenticate the user. SIM 302 also may store data such as personal settings specific to the user. In various embodiments, SIM 302 may be implemented as an UMTS universal SIM (USIM) card or a CDMA removable user identity module (RUIM) card. In some implementations, SIM 302 may comprise a SIM application toolkit (STK) comprising a set of programmed commands for enabling the SIM 302 to perform various functions and/or to independently control aspects of mobile computing device 100.

Radio sub-system 200 may comprise a transceiver module 304 coupled to the radio processor 300. Transceiver module 304 may comprise one or more transceivers arranged to communicate using different types of protocols, communication ranges, operating power requirements, RF sub-bands, information types (e.g., voice or data), use scenarios, applications, and so forth. In various embodiments, transceiver module 304 may comprise one or more transceivers arranged to support voice communication for a cellular telephone system such as a GSM, UMTS, and/or CDMA system.

Transceiver module 304 also may comprise one or more transceivers arranged to perform data communications in accordance with one or more wireless communications protocols such as WWAN protocols (e.g., GSM/GPRS protocols, CDMA/1xRTT protocols, EDGE protocols, EV-DO protocols, EV-DV protocols, HSDPA protocols, etc.), WLAN protocols (e.g., IEEE 802.11a/b/g/n, IEEE 802.16, IEEE 802.20, etc.), PAN protocols, Infrared protocols, Bluetooth protocols, EMI protocols including passive or active RFID protocols, and so forth. In some embodiments, transceiver module 304 may comprise a Global Positioning System (GPS) transceiver to support position determination and/or location-based services.

Transceiver module 304 may be implemented using one or more chips as desired for a given implementation. In various embodiments, transceiver module 304 may include multiple transceivers and associated hardware and/or software components implemented in a single integrated package or module, such as on the same die, package or PCB. Although the transceiver module 304 may be shown as being separate from and external to radio processor 300 for purposes of illustration, it is worthy to note that in various embodiments some portion or the entire transceiver module 304 may be included on the same integrated circuit as the radio processor 300.

Transceiver module 304 may be coupled to an antenna system 306 through a power amplifier (PA) 308. PA 308 may be arranged to work in all frequency bands and/or modulation modes supported by transceiver module 304. PA 308 may be used to provide conducted power $P_c$ to antenna system 306 and to amplify signals to be transmitted over wireless shared media.

Antenna system 306 may be arranged to transmit and receive electrical signals and may be implemented as one or more internal antennas, external antennas, or a combination of both. Although FIG. 3 illustrates a single antenna for purposes of clarity, it may be appreciated that antenna system 306 may comprise multiple antennas in the form an antenna array. Multiple antennas may be desirable when implementing spatial diversity techniques (e.g., beamforming) and/or high-throughput Multiple-Input-Multiple-Output (MIMO) systems (e.g., 802.11n and 802.16e systems).

Antenna system 306 may transmit and/or receive electrical signals via wireless shared media such as one or more bands or sub-bands of RF spectrum. During transmission, antenna system 306 may accept energy from a transmission line and radiate energy into space via a wireless shared media. During reception, antenna system 306 may gather energy from an incident wave received over the wireless shared media, and provide energy to a corresponding transmission line. In various embodiments, antenna system 306 may operate in accordance with a desired Voltage Standing Wave Ratio (VSWR) value related to the impedance match of an antenna feed point and a conducting transmission line. To radiate RF energy with minimum loss and/or to pass received RF energy to a receiver with minimum loss, antenna impedance may need to be matched to the impedance of the conducting transmission line.

Antenna system 306 may be tuned for operating at one or more frequency bands. In some embodiments, mobile computing device 100 may be implemented as a multi-band wireless device supporting operation in multiple frequency bands. In addition, antenna system 306 may be used to implement various spatial diversity techniques to improve communication of wireless signals across one or more frequency bands of wireless shared media such as EV-DO diversity at both the cellular band and Personal Communications Service (PCS) band.

In various embodiments, the antenna system 306 may allow mobile computing device 100 to operate in one or more frequency bands for GSM communication such as the 850 MHz frequency band (GSM-850), the 900 MHz frequency band (GSM-900), the 1800 MHz frequency band (GSM-1800), and/or the 1900 MHz frequency band (GSM-1900), as defined by the European Telecommunications Standards Institute (ETSI). In the United States, GSM-850 (cellular) and GSM-1900 (PCS) typically are used for GSM service. In many international countries, GSM-900 and GSM-1800 (DCS) are used for GSM service. Extended GSM (L-GSM) and Railways GSM (GSM-R) are variants included in the GSM-900 specification that provide extended coverage and additional channels.

Although some embodiments may be described in the context of GSM communication for purposes of illustration, it can be appreciated that the power saving systems and techniques described herein may be employed for other types of cellular telephone systems such as CDMA systems, UMTS systems, NADC systems, TDMA systems, L-TDMA systems, NAMPS systems, and so forth.

As shown, the antenna system 306 may radiate an amount of power referred to as total radiation power (TRP). In general, the TRP of the mobile computing device 1100 is the sum of all power radiated by the antenna system 306 regardless of direction or polarization. In order to maintain desired communication quality, most carriers establish minimum over the air threshold requirements for TRP. For example, some GSM network carriers require a 22 dBm minimum TRP threshold at cellular band and a 24.5 dBm minimum TRP threshold at PCS band. In general, if the TRP of the mobile computing device 1100 meets or exceeds the minimum TRP threshold required by the network, the mobile computing device 100 will receive good quality of service (QoS). If the TRP of the mobile computing device 100 is below the minimum TRP threshold required by the network, more power must be input into the antenna system 306 from the battery to obtain the same QoS.

In one or more embodiments, the mobile computing device 100 may be implemented as a GSM handheld device designed to operate in the cellular band for a network carrier requiring a 22 dBm minimum TRP threshold. The TRP of the mobile computing device 100 is a function of the conducted power $P_c$ input into antenna system 306 as well as impedance mismatch of the antenna system 306 and radiation efficiency of antenna system 306. In some cases, the mobile computing device 100 may be arranged to supply 32 dBm of conducted power $P_c$ to antenna system 306 resulting in 23 dBm TRP when the mobile computing device is in the talk position (e.g., against the head of the user) and 24 dBm TRP in free space (e.g., hands-free environment). It can be appreciated that when the mobile computing device 100 is held in the talk position, energy radiating from the mobile computing device 100 is absorbed by the head of the user. The human head is a lossy dielectric material and typically may absorb 1-6 dB energy radiating from a portable device.

When providing 23 dBm TRP in talk position and 24 dBm TRP in free space, the mobile computing device 100 may exceed the 22 dBm minimum TRP threshold required by the network carrier and receive good QoS in all user environments. Traditionally, the conducted power $P_c$ of a GSM device remains the same in all user environments, whether in talk position or in free space. In such cases, however, excess TRP above the minimum TRP threshold established by the network carrier is provided at the expense of battery life.

In one or more embodiments, the mobile computing device 100 may achieve power savings by setting different power levels based on user environment. For example, the mobile computing device 100 may be arranged to determine a user environment by detecting antenna impedance which varies according to the proximity of the mobile computing device 100 to the user. The mobile computing device 100 may adjust or select a particular power level depending on the user environment to save power while maintaining acceptable QoS.

In various embodiments, the radio sub-system 200 may comprise impedance sense circuitry 310 designed to detect the antenna impedance of the antenna system 306. Impedance sense circuitry 310 may be arranged to continuously, periodically, and/or responsively detect antenna impedance. Impedance sense circuitry 310 may be implemented within the mobile computing device 100 by impedance bridge circuitry, impedance meter circuitry, antenna analyzer circuitry, radiometer circuitry, circuitry elements (resistors, inductors, capacitors), transformers, (coaxial or microstrip), and/or other suitable circuitry in accordance with the described embodiments.

Antenna impedance detected by the impedance sense circuit 310 may vary based on user environment. For example, antenna impedance detected by the impedance sense circuit 310 will be higher in free space when the head of the user is relatively far away from the mobile computing device 100 than when the mobile computing device 100 is positioned against head of the user. The antenna impedance detected by the impedance sense circuit 310 changes and becomes lower as the handheld is moved closer to the head of the user.

As shown, radio sub-system 200 may comprise or implement a power control module (PCM) 312. In various embodiments, PCM 312 may be implemented by one or more hardware components, software components, and/or combination thereof. For example, PCM 312 may be implemented by power control logic (e.g., instructions, data, and/or code) such as software to be executed by a logic device (e.g., radio processor 300). The power control logic may be stored internally or externally to a logic device on one or more types of computer-readable storage media such as memory 314. Although the memory 314 may be shown as being separate from and external to the radio processor 300 for purposes of illustration, it is worthy to note that in various embodiments some portion or the entire memory 314 may be included on the same integrated circuit as radio processor 300. It also can be appreciated that power control logic may be stored by other types of computer-readable media and executed by other types of logic devices implemented by mobile computing device 100.

In operation, PCM 312 may implement power saving techniques for the mobile computing device 100. In various embodiments, PCM 312 may be arranged to determine a user environment or the proximity of the mobile computing device 100 to the user based on antenna impedance detected by the impedance sense circuitry 310. For example, PCM 312 may calculate or derive the distance between the mobile computing device 100 and the head of the user according to the detected antenna impedance.

After the user environment is determined, PCM 312 may confirm that TRP for the mobile computing device 100 at an initial conducted power level exceeds the minimum TRP threshold required by the network carrier to receive acceptable QoS for the particular user environment. For example, at a conducted power $P_c$ level of 32 dBm, a GSM handheld device may be designed to provide 23 dBm TRP in talk position and 24 dBm TRP in free space both of which exceed the 22 dBm minimum TRP threshold required by a GSM network carrier at cellular band.

Based on the excess TRP for the particular user environment (e.g., 1 dBM in talk position, 2 dBm in free space), PCM 312 may determine a reduced conducted power level (e.g., 31 dBM in talk position, 3 dBM in free space) to be input to antenna system 306. In various embodiments, the reduced power level may result in the mobile computing device 100 providing a reduced TRP that at least meets a specific TRP threshold (e.g., 22 dBM minimum TRP threshold) to achieve an acceptable or desired QoS. It can be appreciated that in some embodiments, the specific TRP threshold may be higher than the minimum TRP threshold of network carrier.

The mobile computing device 100 may be arranged to control or limit the amount of power drained from or supplied by the battery to input the reduced conducted power level to antenna system 306 and achieve the specific TRP threshold. In various embodiments, the PCM 312 may instruct radio processor 300 to control or limit power drained from or supplied by the battery in the power management system 206.

When implemented as a GSM handheld device designed to operate in the cellular band for a network carrier requiring a 22 dBm minimum TRP threshold, the mobile computing device 100 may reduce conducted power from 32 dBM to 31 dBM in talk position to achieve 21% power savings while providing 22 dBm TRP and still maintaining acceptable QoS. In free space, the mobile computing device 100 may reduce conducted power from 32 dBM to 30 dBM to achieve 34% power savings while providing 22 dBm TRP and maintaining acceptable QoS.

Although some embodiments may be described in the context of a GSM handheld device for purposes of illustration, it can be appreciated that the power saving systems and techniques described herein may be employed for handheld CDMA devices, handheld UMTS devices, or any other type of device in accordance with the described embodiments. In addition, while some embodiments may be described with respect to distance between a handheld device and the head of the user, it can be appreciated that the described power saving systems and techniques may be employed for a hand-touch device such as a PDA or other mobile computing device where close proximity of the hand of a user may result in radiated energy absorption.

Figure 4:
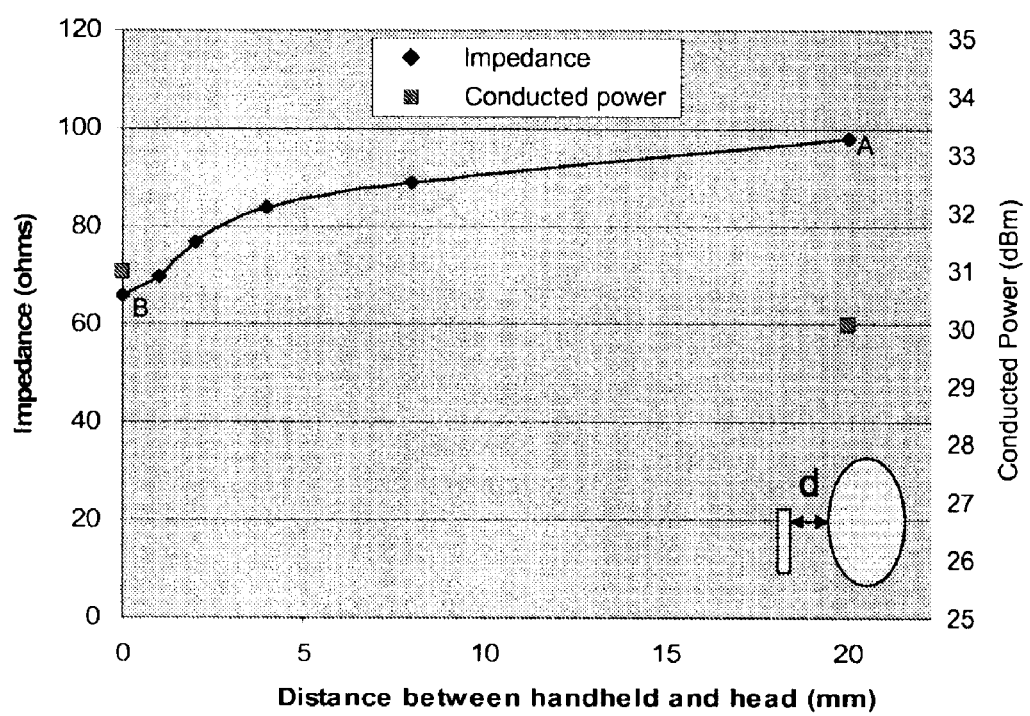
FIG. 4 illustrates one embodiment of antenna impedance and conducted power for different user environments.

FIG. 4 illustrates a graphical depiction of antenna impedance with respect to distance (d) between a GSM handheld device (e.g., mobile computing device 100) and the head of the user in accordance with one or more embodiments. FIG. 4 also shows reduced conducted power levels implemented by GSM handheld device when in free space (point A) and in talk position (point B). It can be appreciated that exemplary values are provided for purposes of illustration and not limitation.

In this embodiment, detected antenna impedance is 98 ohms in free space at point A when the head of the user is relatively far away from the handheld device (e.g., d=20 mm). As shown by the graph, antenna impedance changes and becomes lower as the handheld device is moved closer to the head of the user. When the handheld is positioned against head (e.g., d=0) at point B, detected antenna impedance is 66 ohms.

At point A, the detected antenna impedance is 98 ohms indicating that the handheld is in free space. In free space, the handheld may provide 24 dBm TRP at 32 dBm conducted power which may exceed the 22 dBm minimum TRP threshold required by a GSM network carrier at cellular band by 2 dB. In this case, the handheld device may reduce conducted power to 30 dBm based on the excess TRP for the particular user environment saving 34% power.

At point B, the detected antenna impedance is 66 ohms indicating that the handheld is in talk position. In talk position, the handheld may provide 23 dBm TRP at 32 dBm conducted power which may exceed the 22 dBm minimum TRP threshold required by a GSM network carrier at cellular band by 1 dB. In this case, the handheld device may reduce conducted power to 31 dBm based on the excess TRP for the particular user environment saving 21% power.

For a particular user environment or distance at any point between point A and point B, a linear algorithm or other suitable methodology may be employed to calculate the amount of conducted power to input into an antenna. In various implementations, detected impedance values between point A and point B may be divided into several sections and associated with different reduced power levels. The embodiments are not limited in this context.

In some implementations, power saving techniques may be provided on a configurable, selectable, and/or optional basis. For example, if battery life is above a certain level (e.g., 50% power), a constant conducted power level (e.g., initial 32 dBm conducted power level or 31 dBm reduced conducted power level in talk position) may be supplied to an antenna regardless of the user environment or proximity of the handheld device to the user. If battery life falls below a certain level, conducted power may be gradually or severely reduced to save more power.

Figure 5:
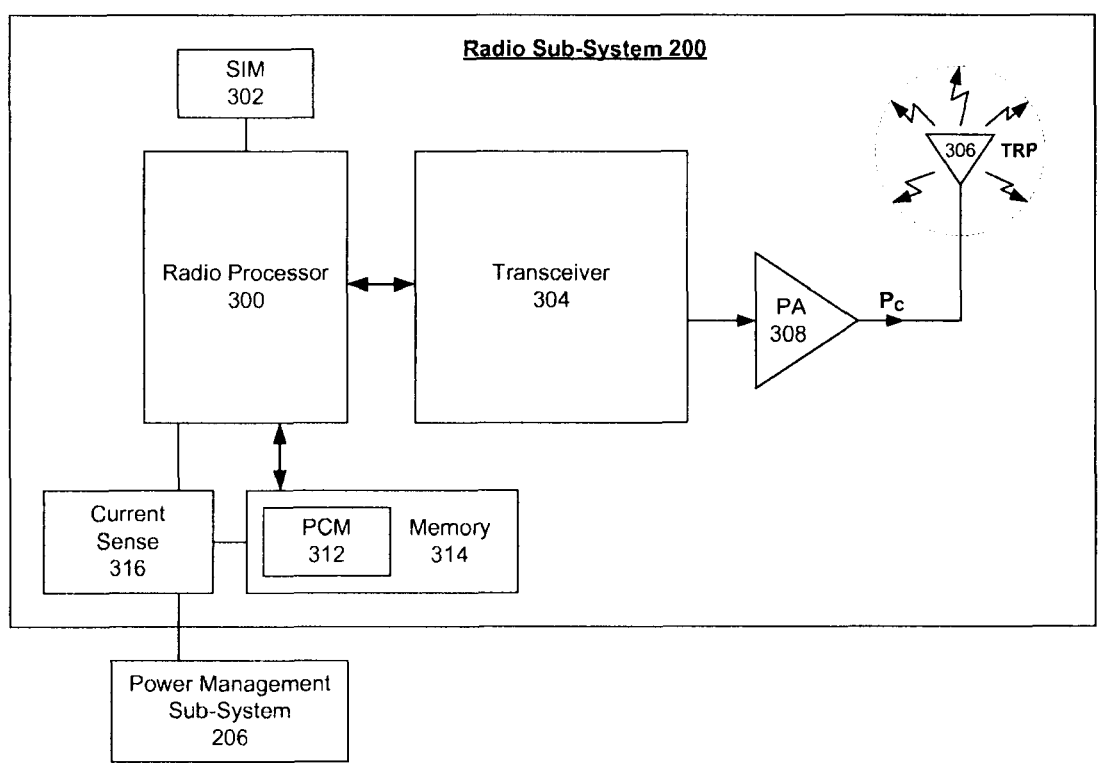
FIG. 5 illustrates one embodiment of a radio sub-system.

FIG. 5 illustrates a block diagram of one embodiment of radio sub-system 200 as described with reference to FIG. 2. Radio sub-system 200 may perform voice and/or data communication operations for mobile computing device 100. As shown in FIG. 5, radio sub-system 200 may comprise a radio processor 300, SIM 302, transceiver module 304, antenna system 306, PA 308 which may be implemented as described above.

Power savings may be achieved by setting different power levels based on user environment. As described above, antenna impedance varies according to the proximity of the mobile computing device 100 to the user. At the same time, antenna impedance variation may lead to mismatching between antenna system 306 and power amplifier 308. Such mismatching will cause a change in the current drained from the battery of power management sub-system 206.

In this embodiment, the mobile computing device 100 may be arranged to determine a user environment by detecting current which varies according to the proximity of the mobile computing device 100 to the user. The mobile computing device 100 may adjust or select a particular power level depending on the user environment to save power while maintaining acceptable QoS. In various implementations, the mobile computing device 100 may be arranged to determine and compensate for the effect of antenna impedance mismatch.

As shown, the radio sub-system 200 may comprise current sense circuitry 316 designed to detect the current drained from the battery of power management sub-system 206. Current sense circuitry 316 may be arranged to continuously, periodically, and/or responsively detect current consumption. Current detected by the current sense circuit 316 may vary based on user environment. For example, as the handheld is moved closer to the head of the user, there is greater impedance mismatch (e.g., higher VSWR) and current detected by the current sense circuit 316 will be higher than when the handheld is in free space. Current sense circuitry 316 may be implemented within the mobile computing device 100 by a resistor (e.g., 0.2Ω resistor) and an ADC arranged to measure voltage drop across the resistor, current meter circuitry, circuitry elements (resistors, inductors, capacitors), and/or other suitable circuitry in accordance with the described embodiments.

Radio sub-system 200 may comprise or implement PCM 312 in memory 314. In operation, PCM 312 may implement power saving techniques for the mobile computing device 100. In various embodiments, PCM 312 may be arranged to determine a user environment or the proximity of the mobile computing device 100 to the user based on current detected by the current sense circuitry 316. For example, PCM 312 may calculate or derive the distance between the mobile computing device 100 and the head of the user according to the detected current.

After the user environment is determined, PCM 312 may confirm that TRP for the mobile computing device 100 at an initial conducted power level exceeds the minimum TRP threshold required by the network carrier to receive acceptable QoS for the particular user environment. Based on the excess TRP for the particular user environment (e.g., 1 dBM in talk position, 2 dBM in free space), PCM 312 may determine a reduced conducted power level (e.g., 31 dBM in talk position, 3 dBM in free space) to be input to antenna system 306. The reduced power level may result in mobile computing device 100 providing a reduced TRP that at least meets a specific TRP threshold (e.g., 22 dBM minimum TRP threshold) to achieve an acceptable or desired QoS.

The mobile computing device 100 may be arranged to control or limit the amount of power drained from or supplied by the battery to input the reduced conducted power level to antenna system 306 and achieve the specific TRP threshold. In various embodiments, PCM 312 may instruct radio processor 300 to control or limit power drained from or supplied by the battery in the power management system 206.

When implemented as a GSM handheld device designed to operate in the cellular band for a network carrier requiring a 22 dBm minimum TRP threshold, the mobile computing device 100 may reduce conducted power from 32 dBM to 31 dBM in talk position to achieve power savings while providing 22 dBm TRP and still maintaining acceptable QoS. In free space, the mobile computing device 100 may reduce conducted power from 32 dBM to 30 dBM to achieve power savings while providing 22 dBm TRP and maintaining acceptable QoS.

It can be appreciated that the power saving systems and techniques described herein may be employed for handheld GSM devices, handheld CDMA devices, handheld UMTS devices, or any other type of device in accordance with the described embodiments. In addition, the described power saving systems and techniques may be employed for a hand-touch device such as a PDA or other mobile computing device where close proximity of the hand of a user may result in radiated energy absorption.

Figure 6:
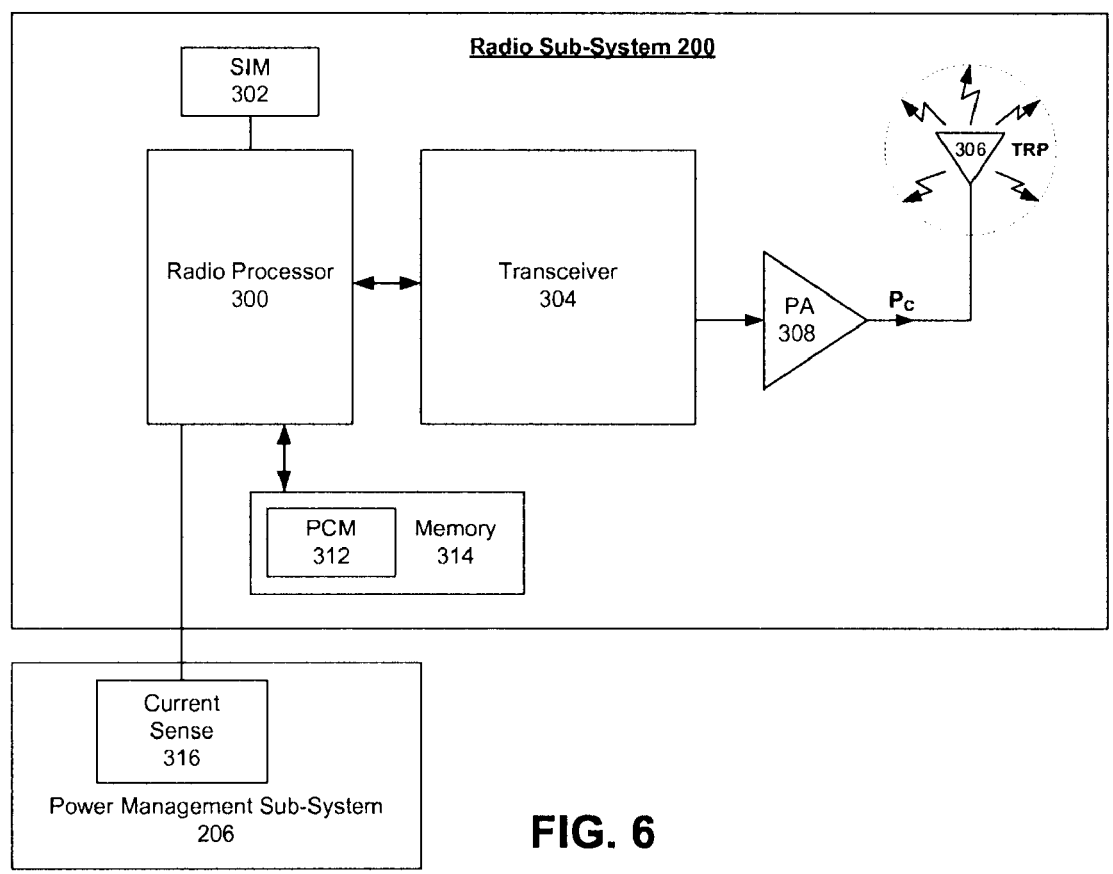
FIG. 6 illustrates one embodiment of a radio sub-system.

FIG. 6 illustrates a block diagram of one embodiment of radio sub-system 200 as described with reference to FIG. 2. Radio sub-system 200 may perform voice and/or data communication operations for mobile computing device 100. As shown in FIG. 6, radio sub-system 200 may comprise a radio processor 300, SIM 302, transceiver module 304, antenna system 306, PA 308 which may be implemented as described above.

Power savings may be achieved by setting different power levels based on user environment. As described above, the proximity of the mobile computing device 100 to the user may cause a change in the current drained from the battery of power management sub-system 206. The mobile computing device 100 may determine a user environment by detecting current which varies according to the proximity of the mobile computing device 100 to the user. The mobile computing device 100 may adjust or select a particular power level depending on the user environment to save power while maintaining acceptable QoS. In various implementations, the mobile computing device 100 may be arranged to determine and compensate for the effect of antenna impedance mismatch.

In this embodiment, power management sub-system 206 may comprise current sense circuitry 316 designed to detect the current drained from the battery. Current sense circuitry 316 may be arranged to continuously, periodically, and/or responsively detect current consumption. Current detected by the current sense circuit 316 may vary based on user environment. For example, as the handheld is moved closer to the head of the user, current detected by the current sense circuit 316 will be higher than when the handheld is in free space.

Current sense circuitry 316 may be implemented within the power management sub-system 206 by one or more ICs, chips, chipsets, and/or circuitry. In some embodiments, for example, the current sense circuitry 316 may comprise a gas gauge implemented by, or interfaced with, the battery pack within power management sub-system 206. The gas gauge may comprise, for example, an IC, chip or chipset arranged to interface with the battery pack and to measure current flow into and out of the battery. In such embodiments, the gas gauge may be interrogated at any time to determine current consumption, capacity, remaining power of the battery, and/or other parameters. In other embodiments, the current sense circuitry 316 may comprise or form part of a power management IC, chip or chipset arranged to interface with the battery and to control power supply, battery charging, and other power related functions for mobile computing device 100.

Radio sub-system 200 may comprise or implement PCM 312 in memory 314. In operation, PCM 312 may implement power saving techniques for the mobile computing device 100. In various embodiments, PCM 312 may instruct radio processor 300 to interrogate current sense circuitry 316 in power management system 206 to detect current and/or determine current consumption. In some implementations, the current detected by current sense circuitry 316 may correspond to the current consumption of radio sub-system 200. In other implementations, the current detected by current sense circuitry 316 may correspond to the total current consumption of mobile computing device 100. In such cases, the current consumption for radio sub-system 200 may be determined by subtracting known or expected current consumption values for other components from the total current being consumed by mobile computing device 100.

In various embodiments, PCM 312 may be arranged to determine a user environment or the proximity of the mobile computing device 100 to the user based on current detected by the current sense circuitry 316. For example, the PCM 312 may calculate or derive the distance between the mobile computing device 100 and the head of the user according to the detected current.

After the user environment is determined, the PCM 312 may confirm that TRP for the mobile computing device 100 at an initial conducted power level exceeds the minimum TRP threshold required by the network carrier to receive acceptable QoS for the particular user environment. Based on the excess TRP for the particular user environment (e.g., 1 dBM in talk position, 2 dBM in free space), the PCM 312 may determine a reduced conducted power level (e.g., 31 dBM in talk position, 3 dBM in free space) to be input to antenna system 306. The reduced power level may result in mobile computing device 100 providing a reduced TRP that at least meets a specific TRP threshold (e.g., 22 dBM minimum TRP threshold) to achieve an acceptable or desired QoS.

The mobile computing device 100 may be arranged to control or limit the amount of power drained from or supplied by the battery to input the reduced conducted power level to antenna system 306 and achieve the specific TRP threshold. In various embodiments, the PCM 312 may instruct radio processor 300 to control or limit power drained from or supplied by the battery in the power management system 206.

When implemented as a GSM handheld device designed to operate in the cellular band for a network carrier requiring a 22 dBm minimum TRP threshold, the mobile computing device 100 may reduce conducted power from 32 dBM to 31 dBM in talk position to achieve power savings while providing 22 dBm TRP and still maintaining acceptable QoS. In free space, the mobile computing device 100 may reduce conducted power from 32 dBM to 30 dBM to achieve power savings while providing 22 dBm TRP and maintaining acceptable QoS.

It can be appreciated that the power saving systems and techniques described herein may be employed for handheld GSM devices, handheld CDMA devices, handheld UMTS devices, or any other type of device in accordance with the described embodiments. In addition, the described power saving systems and techniques may be employed for a hand-touch device such as a PDA or other mobile computing device where close proximity of the hand of a user may result in radiated energy absorption.

Figure 7:
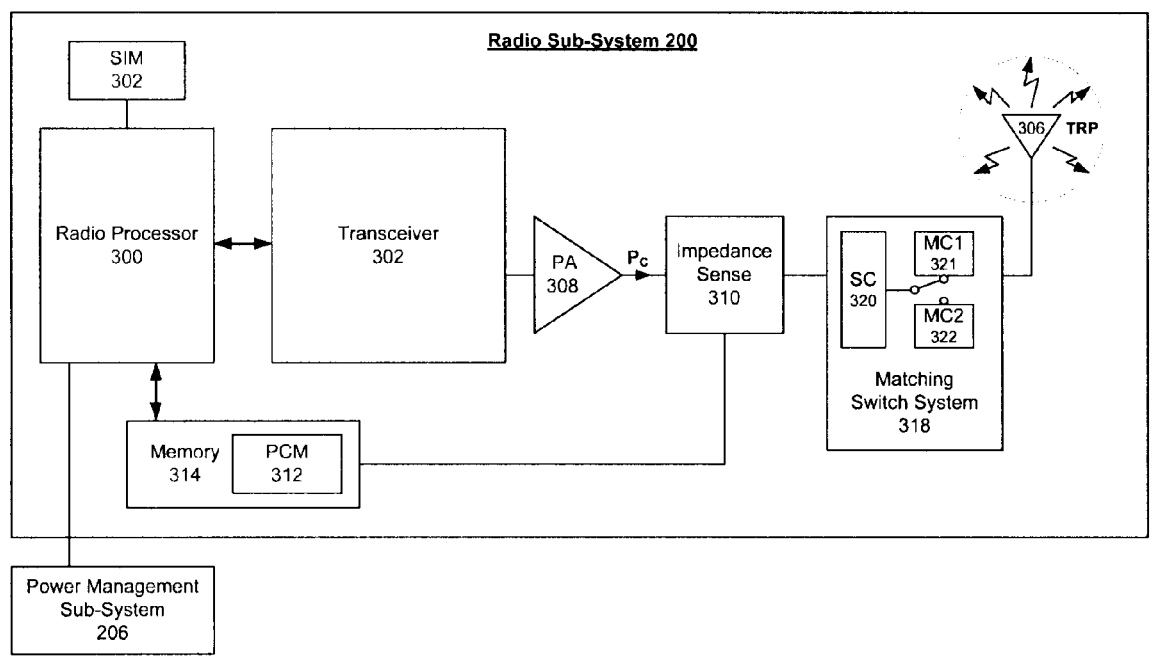
FIG. 7 illustrates one embodiment of a radio sub-system.

FIG. 7 illustrates a block diagram of one embodiment of radio sub-system 200 as described with reference to FIG. 2. Radio sub-system 200 may perform voice and/or data communication operations for mobile computing device 100. As shown in FIG. 7, radio sub-system 200 may comprise a radio processor 300, SIM 302, transceiver module 304, antenna system 306, PA 308, and impedance sense circuitry 310, which may be implemented as described above.

Power savings may be achieved by setting different power levels based on user environment. For example, the mobile computing device 100 may be arranged to determine a user environments by detecting antenna impedance which varies according to the proximity of the mobile computing device 100 to the user. The mobile computing device 100 may adjust or select a particular power level depending on the user environment to save power while maintaining acceptable QoS.

As described above, antenna impedance varies according to the proximity of the mobile computing device 100 to the user. At the same time, antenna impedance variation may lead to mismatching between antenna system 306 and power amplifier 308. In general, antenna impedance matches well with PA 308 in free space, but not in talk position. Talk position is the worst case of all user environments where the head of the user absorbs the maximum power from the mobile computing device 100. In contrast, the head of the user absorbs the minimum power from the mobile computing device 100 in free space.

Impedance sense circuitry 310 may be arranged to continuously, periodically, and/or responsively detect antenna impedance, and PCM 312 may be arranged to determine a user environment or the proximity of the mobile computing device 100 to the user based on antenna impedance detected by the impedance sense circuitry 310.

In this embodiment, the radio sub-system 200 may comprise a matching switch system 318 within the mobile computing device 100 designed automatically adjust antenna matching in different user environment in order to maintain the minimum conducted power and extend battery life. Matching switch system 318 may be implemented by various circuitry elements (resistors, inductors, and capacitors), diodes, transformers, and/or other suitable circuitry in accordance with the described embodiments. Components or groups of components within the matching switch system 318 may be continuously, periodically, and/or responsively adjusted on an individual or group basis to compensate for antenna impedance mismatch.

As shown, matching switch system 318 may comprise a switch controller (SC) 320 arranged to mechanically or otherwise switch among two or more matching circuitries including a first matching circuitry (MC1) 321 and a second matching circuitry (MC2) 322. In various embodiments, MC1 321 may be used for a first user environment (e.g., free space) and MC2 322 may be used for a second user environment (e.g., talk position). In such embodiments, MC2 322 may comprise matching circuitry designed to compensate for antenna impedance mismatch. It can be appreciated that while MC1 321 and MC2 322 are shown for purposes of illustration, matching switch system 318 may include addition matching circuitries associated with different user environments in accordance with the described embodiments.

After the user environment is determined, the SC 320 may be arranged to automatically adjust and/or improve antenna impedance matching. For example, if the detected antenna impedance is 98 ohms indicating that the handheld is in free space, there is relatively good impedance matching between antenna system 306 and PA 308. SC 320 may switch or connect to MC1. In free space, the handheld may provide 24 dBm TRP at 32 dBm conducted power which may exceed the 22 dBm minimum TRP threshold required by a GSM network carrier at cellular band by 2 dB. In this case, the handheld device may reduce conducted power to 30 dBm based on the excess TRP for the particular user environment to achieve power savings.

If the antenna impedance detected by the impedance sense circuitry 310 is 66 ohms indicating that the handheld is in talk position, there is mismatching between antenna system 306 and PA 308. SC 320 may switch or connect to MC2 to provide better antenna impedance matching. In talk position, the handheld may exceed the minimum TRP threshold by 1 dB, and matching switch system 318 may provide better antenna impedance matching. In this case, the handheld device may reduce conducted power to 30 dBm based on the excess TRP and improved antenna impedance matching for the particular user environment to achieve power savings.

When implemented as a GSM handheld device designed to operate in the cellular band for a network carrier, mobile computing device 100 may reduce conducted power from 32 dBM to 30 dBM in talk position as well as in free space to achieve power savings while providing 22 dBm TRP and maintaining acceptable QoS.

It some embodiments, user environment or the proximity of the mobile computing device 100 to the user may be determined based on current detected by current sense circuitry 316. Accordingly, in such embodiments, the matching switch system 318 may be used in conjunction with current sense circuitry 316 to provide improved antenna impedance matching and power savings.

It can be appreciated that the power saving systems and techniques described herein may be employed for handheld GSM devices, handheld CDMA devices, handheld UMTS devices, or any other type of device in accordance with the described embodiments. In addition, the described power saving systems and techniques may be employed for a hand-touch device such as a PDA or other mobile computing device where close proximity of the hand of a user may result in radiated energy absorption.

Figure 8:
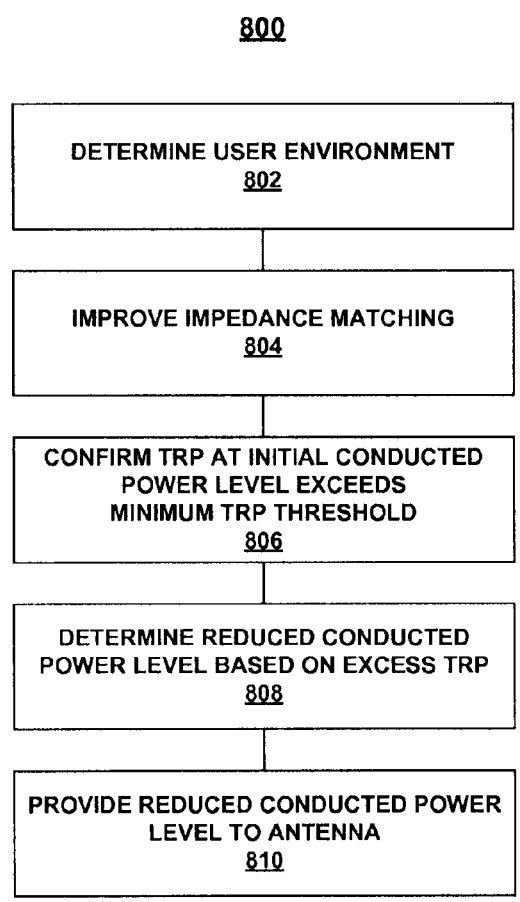
FIG. 8 illustrates one embodiment of a power control logic flow.

FIG. 8 illustrates a power control logic flow 800 in accordance with one or more embodiments. The logic flow 800 may be performed by various systems and/or devices and may be implemented as hardware, software, and/or any combination thereof, as desired for a given set of design parameters or performance constraints. For example, the logic flow 800 may be implemented by a logic device (e.g., processor) and/or logic comprising instructions, data, and/or code to be executed by a logic device.

The logic flow 800 may comprise determining a user environment (block 802). In some embodiments, the user environment may be determined based on detected antenna impedance which varies according to the proximity of a mobile computing device 100 to a user. For example, detected antenna impedance will be higher in free space when the head of the user is relatively far away from the mobile computing device 100 than when the mobile computing device 100 is positioned against head of the user. The detected antenna impedance changes and becomes lower as the mobile computing device 100 is moved closer to the head of the user.

In some embodiments, the user environment may be determined based on detected current which varies according to the proximity of the mobile computing device 100 to a user. Antenna impedance variation may lead to mismatching causing a change in the current drained from a battery of the mobile computing device. For example, as the mobile computing device 100 is moved closer to the head of the user, there is greater impedance mismatch and detected current will be higher than when the mobile computing device 100 is in free space.

The logic flow 800 may comprise improving impedance matching (block 804). In various embodiments, the mobile computing device may automatically adjust and/or improve antenna impedance matching based on user environment allowing a further reduction in conducted power. For example, if the mobile computing device 100 is in free space, there is relatively good impedance matching. If the mobile computing device 100 is in talk position, there is impedance mismatching. In talk position, appropriate matching circuitry may be used to connect to antenna to provide better antenna impedance matching.

The logic flow 800 may comprise confirming that TRP for the mobile computing device 100 at an initial conducted power level exceeds a minimum TRP threshold (block 806). In various embodiments, the minimum TRP threshold may be established by a network carrier to receive acceptable QoS. At an initial conducted power level, the mobile computing device 100 may be designed to provide TRP which exceeds the TRP threshold required by the network carrier in both talk position and in free space 24 dBm.

The logic flow 800 may comprise determining a reduced conducted power level based on the excess TRP for the particular user environment (block 808) and providing the reduced conducted power level to an antenna system 306 (block 810). In various embodiments, the mobile computing device 100 may adjust or select a particular power level depending on the user environment to save power while maintaining acceptable QoS. The reduced power level may result in the mobile computing device 100 providing a reduced TRP that at least meets a specific TRP threshold (e.g. minimum TRP threshold) to achieve an acceptable or desired QoS. The mobile computing device 100 may be arranged to control or limit the amount of power drained from or supplied by the battery to input the reduced conducted power level to the antenna system and achieve the specific TRP threshold.

Numerous specific details have been set forth to provide a thorough understanding of the embodiments. It will be understood, however, that the embodiments may be practiced without these specific details. In other instances, well-known operations, components and circuits have not been described in detail so as not to obscure the embodiments. It can be appreciated that the specific structural and functional details are representative and do not necessarily limit the scope of the embodiments.

Various embodiments may comprise one or more elements. An element may comprise any structure arranged to perform certain operations. Each element may be implemented as hardware, software, or any combination thereof, as desired for a given set of design and/or performance constraints. Although an embodiment may be described with a limited number of elements in a certain topology by way of example, the embodiment may include more or less elements in alternate topologies as desired for a given implementation.

It is worthy to note that some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other. With respect to software elements, for example, the term "coupled" may refer to interfaces, message interfaces, API, exchanging messages, and so forth.

Various embodiments may comprise one or more functional components or modules for performing various operations. It can be appreciated that such components or modules may be implemented by one or more hardware components, software components, and/or combination thereof. The functional components and/or modules may be implemented, for example, by logic (e.g., instructions, data, and/or code) to be executed by a logic device (e.g., processor). Such logic may be stored internally or externally to a logic device on one or more types of computer-readable storage media.

It also is to be appreciated that the described embodiments illustrate exemplary implementations, and that the functional components and/or modules may be implemented in various other ways which are consistent with the described embodiments. Furthermore, the operations performed by such components or modules may be combined and/or separated for a given implementation and may be performed by a greater number or fewer number of components or modules.

Some of the figures may include a flow diagram. Although such figures may include a particular logic flow, it can be appreciated that the logic flow merely provides an exemplary implementation of the general functionality. Further, the logic flow does not necessarily have to be executed in the order presented unless otherwise indicated. In addition, the logic flow may be implemented by a hardware element, a software element executed by a processor, or any combination thereof.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within registers and/or memories into other data similarly represented as physical quantities within the memories, registers or other such information storage, transmission or display devices.

It also is worthy to note that any reference to "one embodiment" or "an embodiment" means that a particular feature, structure, or characteristic described in connection with the embodiment is included in at least one embodiment. The appearances of the phrase "in one embodiment" in the specification are not necessarily all referring to the same embodiment.

While certain features of the embodiments have been illustrated as described above, many modifications, substitutions, changes and equivalents will now occur to those skilled in the art. It is therefore to be understood that the appended claims are intended to cover all such modifications and changes as fall within the true spirit of the embodiments.

The invention claimed is:

1. A mobile computing device comprising:
a battery to supply power to the mobile computing device;
at least one antenna; and
a power control module to determine a user environment of the mobile computing device, confirm that total radiation power (TRP) of the at least one antenna at an initial conducted power level exceeds a minimum threshold TRP of an associated cellular network, said minimum threshold TRP representing a predetermined quality of service (QoS) level from the cellular network, said power control module to determine a reduced conducted power level to input to the at least one antenna; said reduced conducted power level equal to or greater than said minimum threshold TRP; said power control module to provide a constant conducted power level to the antenna regardless of said environment when a remaining life of a battery associated with said mobile computing device is above a predetermined level.

2. The mobile computing device of claim 1, further comprising impedance sense circuitry to detect antenna impedance, the power control module to determine user environment based on detected antenna impedance.

3. The mobile computing device of claim 1, wherein the reduced conducted power level input to the at least one antenna results in a reduced TRP that at least meets the minimum threshold TRP.

4. The mobile computing device of claim 3, wherein the reduced TRP exceeds the minimum threshold TRP.

5. The mobile computing device of claim 1, wherein user environment is based on proximity of the mobile computing device to a user.

6. The mobile computing device of claim 5, wherein user environment is based on distance between the mobile computing device and a head of the user.

7. The mobile computing device of claim 1, the reduced power level based on excess TRP.

8. The mobile computing device of claim 1, the power control module to select from among a plurality of reduced power levels.

9. The mobile computing device of claim 1, the power control module to transition from said initial conducted power level to said reduced conducted power level to reduce power consumption of said battery.

10. The mobile computing device of claim 1, the power control module to select a conducted power level based on an environment of said mobile computing device, said selected power level maintaining said minimum threshold TRP.

11. The mobile computing device of claim 10, the power control module to select conducted power level on at least one of a configurable, a selectable, and an optional basis.

12. The mobile computing device of claim 1, wherein if a remaining life of said battery is below a predetermined level, the power control module to instruct a gradual reduction in conducted power level to the antenna.

13. A method comprising:
determining a user environment of a mobile computing device;

confirming that total radiation power (TRP) of at least one antenna of the mobile computing device at an initial conducted power level exceeds a minimum threshold TRP of an associated cellular network, said minimum threshold TRP representing a predetermined quality of service (QoS) level from the cellular network;

determining a reduced conducted power level to input to the at least one antenna;

said reduced conducted power level equal to or greater than said minimum threshold TRP; and providing a constant conducted power level to the antenna regardless of said environment when a remaining life of a battery associated with said mobile computing device is above a predetermined level.

14. The method of claim 13, further comprising detecting antenna impedance and determining user environment based on detected antenna impedance.

15. The method of claim 13, further comprising providing the reduced conducted power level input to the at least one antenna resulting in a reduced TRP that at least meets the minimum threshold TRP.

16. The method of claim 15, wherein the reduced TRP exceeds the minimum threshold TRP.

17. The method of claim 13, further comprising determining user environment based on proximity of the mobile computing device to a user.

18. The method of claim 17, further comprising determining user environment based on distance between the mobile computing device and a head of the user.

19. The method of claim 13, further comprising improving antenna impedance matching.

20. The method of claim 13, comprising transitioning from said initial conducted power level to said reduced conducted power level to reduce power consumption of a battery associated with said mobile computing device.

21. The method of claim 13, comprising selecting a conducted power level based on an environment of said mobile computing device, said selected conducted power level maintaining said minimum threshold TRP.

22. The method of claim 21, comprising selecting a conducted power level on at least one of a configurable, a selectable, and an optional basis.

23. The method of claim 13, comprising gradually reducing conducted power level to the antenna when a remaining life of a battery associated with said mobile computing device is below a predetermined level.

24. A computer-readable storage medium comprising instructions that if executed enable a computing system to:

determine a user environment of a mobile computing device;

confirm that total radiation power (TRP) of at least one antenna of the mobile computing device at an initial conducted power level exceeds a minimum threshold TRP of an associated cellular network, said minimum threshold TRP representing a predetermined quality of service (QoS) level from the cellular network;

determine a reduced conducted power level to input to the at least one antenna;

said reduced conducted power level equal to or greater than said minimum threshold TRP; and provide a constant conducted power level to the antenna regardless of said environment when a remaining life of a battery associated with said mobile computing device is above a predetermined level.

* * * * *